United States Patent
Scherbaum

[11] 4,023,616
[45] May 17, 1977

[54] THYRISTOR COOLING ARRANGEMENT
[75] Inventor: Friedrich Scherbaum, Erlangen, Germany
[73] Assignee: Siemens Aktiengesellschaft, Munich, Germany
[22] Filed: Apr. 7, 1975
[21] Appl. No.: 565,677
[30] Foreign Application Priority Data
Apr. 8, 1974  Germany .......................... 2417031
[52] U.S. Cl. ....,........................... 165/80; 165/105; 357/82; 165/DIG. 3
[51] Int. Cl.² .................. F28D 15/00; H01L 23/42
[58] Field of Search ............... 165/80, 105, DIG. 3; 357/82

[56] References Cited
UNITED STATES PATENTS

| | | | |
|---|---|---|---|
| 3,004,196 | 10/1961 | Drexel | 357/82 |
| 3,204,157 | 8/1965 | Peterson | 357/82 |
| 3,653,433 | 4/1972 | Scharli | 165/105 X |
| 3,703,668 | 11/1972 | Bylund et al. | 357/82 |
| 3,792,318 | 2/1974 | Fries et al. | 165/105 X |

FOREIGN PATENTS OR APPLICATIONS
791,491  3/1958  United Kingdom ............... 165/105

*Primary Examiner*—Albert W. Davis, Jr.
*Attorney, Agent, or Firm*—Kenyon & Kenyon Reilly Carr & Chapin

[57] ABSTRACT

In a liquid cooled thyristor column in which disk thyristors are stacked along with heat sinks with the disk thyristors and heat sinks held elastically together each heat sink is equipped with a laterally projecting heat pipe having its free end emersed in a coolant line, with the free ends of the heat pipes secured to the coolant lines by means of a membrane. Each heat pipe includes an intermediate section having electrical insulating material and a tube section of elastic material adjacent the heat sink thereby permitting impure cooling liquids to be used.

7 Claims, 2 Drawing Figures

THYRISTOR COOLING ARRANGEMENT

BACKGROUND OF THE INVENTION

This invention relates to liquid cooled thyristor columns having disk thyristors which are elastically held between heat sinks and in which the heat sinks are also used as conductors for electrical current conduction in general and more particularly to an improved method of cooling such a thyristor column which permits cooling the thyristors with unpurified liquids such as water.

Thyristor columns in which a plurality of disk thyristors, each elastically held between heat sinks on each side are arranged in a column are described, for example, in German Offenlegungsschrift No. 1,914,790.

Such thyristor columns are used in bridge circuits wherein a plurality of disk thyristors must be connected in series. For providing liquid cooling in such thyristor columns the heat sinks are installed in a coolant circulation system through insulating intermediate sections. Unpurified coolants may be used, i.e., coolants of low electrical conductivity such as the cheapest coolant water, only if a low voltage is applied to the disk thyristors and if connection paths between the heat sink are suitably long. If higher voltages, e.g. 3kV, are present at the disk thyristors, either the connection paths between heat sinks must be made so long as to not be economically acceptable and/or technically feasible or de-ionized water or another electrically non-conductive liquid must be used as the coolant.

There are known from German Offenlegungsshrifts 2,107,008, 2,107,009, and 2,107,319 various means for cooling disk thyristors using air. In the disclosed arrangements a heat pipe is placed on each of the two end faces of the disk thyristor. Each unit comprising a disk thyristor and two heat pipes is clamped using a clamping device. Cooling fins are provided on the free ends of the heat pipes to enlarge the heat transfer surfaces for a gaseous cooling medium. What is referred to as a heat pipe will be understood by those skilled in the art as that which is described in U.S. Pat. No. 2,350,348 or in the journal "Chemie-Ingenieur-Technik", volume 39, 1967, No. 1, pages 21 to 26. Briefly, a heat pipe comprises a tube or pipe closed on both ends and having its inner wall covered with a wick of capillary structure. The wick is saturated with a liquid working or operating fluid such as freon, methanol, ethanol, acetone, benzene or water. When the portion of the heat pipe termed the vaporization section is heated, the operating liquid vaporizes from the wick and the vapor flows in the direction of lower temperature. At the other end, which is cooled and termed the condensation section, the vapor gives off its heat of vaporization and is again liquefied. The liquid operating fluid is then transported back to the vaporization section of the heat pipe by means of capillary action. In such a heat pipe circulation is obtained for the operating fluid which circulation is independent of position, i.e., it is independent of external forces and can also operate against the force of gravity.

In German Utility Model No. 7,224,356 or German Offenlegungsschrift No. 2,120,474 an electrically insulated heat pipe is described. In that heat pipe the vaporization and condensation sections are electrically insulated from each other by means of a tubular intermediate section of insulating material. Naturally, in such a heat pipe the wick, at least in the zone of the intermediate section of insulating material, and the operating fluid must be electrically non-conducting.

In U.S. Patent application Ser. No. 491,779 now U.S. Pat. No. 3,942,586 an air-cooled thyristor column having disk thyristors is proposed in which devices such as those known from German Offenlegungsshrift Nos. 2,204,589 or 2,107,008 are stacked so that the axes of the heat pipes of superposed heat sinks are rotationally offset relative to each other and with respect to the stackaxis. In this gas cooled thyristor column excellent cooling of all heat pipes is obtained.

It can be seen from the above, that, although liquids are better cooling mediums than gases, problems arise when attempting to liquid cool at high voltages. Thus, it can be seen that there is a need for a liquid cooled system in which an unpurified liquid coolant such as water can be used with such high voltage installations.

SUMMARY OF THE INVENTION

The present invention provides such a device in a thyristor column in which the disk thyristors are elastically clamped between heat sinks. Each heat sink is equipped with a laterally projecting heat pipe having its free end disposed within a coolant line and attached using a flexible membrane. Furthermore, each heat pipe includes an intermediate section of electrically insulating material and has a tube section of elastic material arranged between the electrically insulating intermediate section and the heat sink. The device of the present invention provides an intermediate circulation path comprising the heat pipes to result in conducting heat between the heat sinks and the coolant circulation system. In this secondary system the heat sinks and the coolant circulation system are electrically insulated from each other by means of the insulating sections in the heat pipes. As a result, even a relative high thyristor voltages, a liquid which is electrically conducting can be used as a coolant, i.e., the cooling liquid does not have to be an insulating liquid and, for example, water, which need not be specially purified and need not be de-ionized, can be used. Through the flexible construction of the heat pipes and because of the flexible membrane coupling the heat pipes and the circulation system, thermal stresses and tolerances due to manufacturing tolerances have no effect. It is advantageous if the tube sections which are made of an elastic material be designed such that they and also the heat pipes are self-supporting. The membranes acting as seals between the heat pipes and the coolant circulation system then need only support the heat pipes to a small degree.

DETAILED DESCRIPTION OF THE PREFERRED EMBODIMENT

Figure 1:
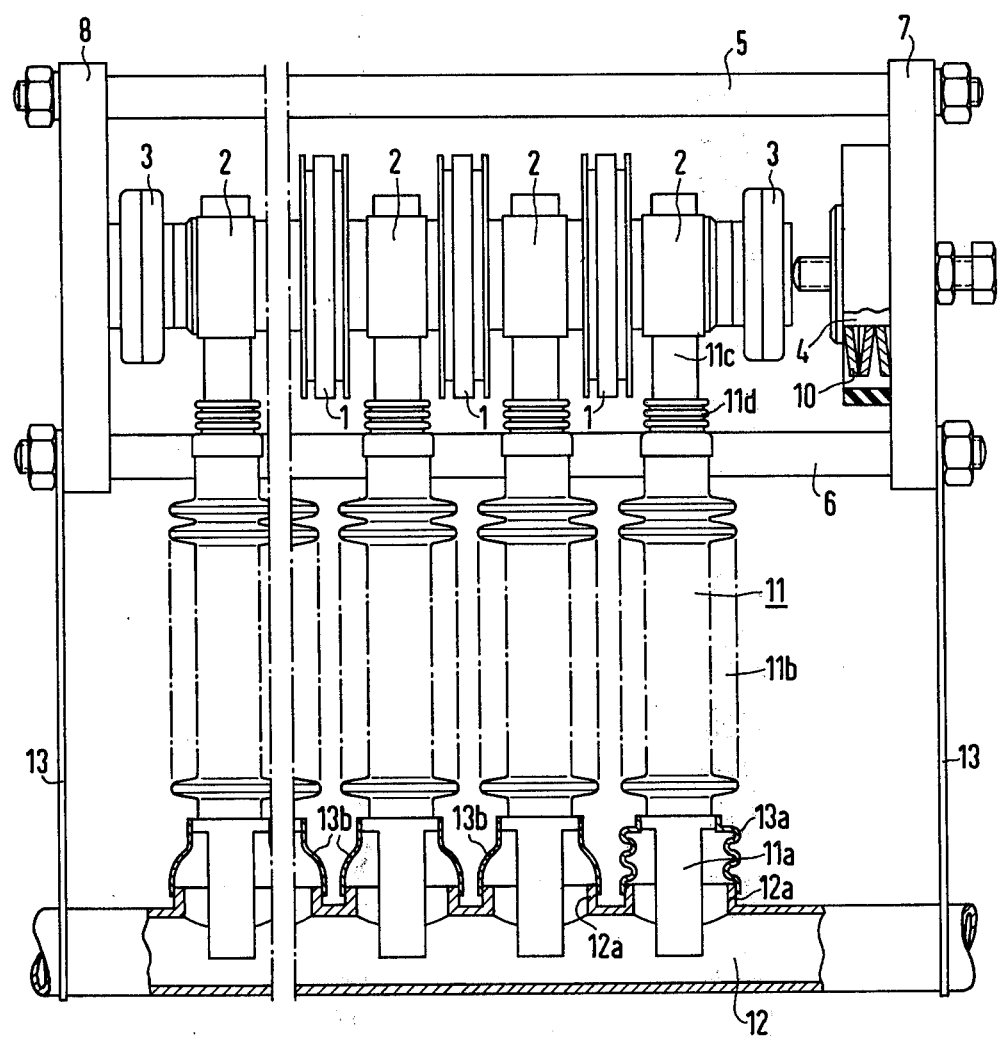
FIG. 1 is a plan view, partially in cross-section, of a thyristor column according to the present invention.

FIG. 1 illustrates a thyristor column which includes a plurality of series connected disk thyristors 1. Each of the disk thyristors 1 is clamped between two heat sinks 2 which are held thereagainst with good thermally conducting contact. By means of insulation pieces 3 and a pressure piece 4, the disk thyristors 1 and heat sinks 2 are clamped together in a frame. Essentially the frame is comprised of bolts 5 and 6 along with two clamping plates 7 and 8. One of the insulating pieces 3 rests on a pressure piece 4. With regard to the construction of the pressure pieces 4 which, as can be seen from the cut-away cross-section, contain cup springs 10 used as energy accumulators to exert an elastic compressive force on the heat sinks 2 and disk thyristors 1, more detail may be had from German Offenlegungsschrift No. 1,914,790. Through this arrangement, electrical and thermal contact between the heat sinks 2 and the disk thyristors1 is insured. Electrical contacts for the disk thyristors 1 are provided directly on the heat sinks 2. These contacts, which are of a type well known in the art are not shown on the figure for purposes of simplicity.

Each heat sink 2 has a heat pipe 11 connected thereto in such a manner as to make thermal contact. The vaporization end of the heat pipe 11 is inserted into the heat sinks 2 in the manner illustrated. The free end 11a of each of the heat pipes, i.e. the condensation section, is immersed in a coolant line 12. All heat pipes 11 lie in a plane leading to a flat planar construction of the thyristor column and thus keeping its volume small. The coolant line 12 is secured by means of supports 13 to the clamping plates 7 and 8 of the clamping device for the thyristor column. Each heat pipe includes an intermediate section 11b which will be made of an electrically insulating material such as a ceramic. In the illustrated embodiment the insulating intermediate section 11b is provided with ribs in order to allow for expansion in conventional manner. The electrically insulating intermediate section 11b of each heat tube is secured on one side to the tube end 11a which is the free end disposed in the coolant line 12 and acts as the condensation section of the heat pipe. The heat pipe section 11a may, for example, be made of a copper alloy. The other end of the insulating intermediate section 11b is connected to a tube portion 11c. At each heat pipe 11 the tube 11c opens into a heat sink 2. This section 11c may also be made of a copper alloy. In all the heat pipes 11a flexible or elastic tube section 11d of the tube 11c, is arranged between the heat sinks 2 and the electrically insulating intermediate section 11b. In the illustrated embodiment, the elastic tube section 11d is a corrugated tube which may be, for example, a copper alloy.

On FIG. 1, the point where the heat pipes 11 are attached to the coolant line 12 is shown in cut-away cross- section. For each heat pipe 11 the coolant line includes pipe connections 12a having a diameter greater than the diameter of the free ends 11a of the heat pipes 11. A membrane 13a or 13b is used to fasten each heat pipe 11 to one of the two flanges 12a. The illustration of FIG. 1 shows two different forms of construction of the elastic membrane. It may be a corrugated tube 13a as illustrated on the right-hand side or may be a bell-shaped intermediate piece 13b. The membrane 13a or 13b may be made of rubber of plastic.

In the illustrated embodiment, the elastic tube sections 11d are corrugated tubes which are self-supporting. As a result the heat pipes 11 are also self-supporting and the membranes 13a and 13b only need to exert a small force to properly retain the heat pipes 11. Naturally, the design can be modified so that the membranes 13a and 13b are used for a greater degree of support in which case a self-supporting tube section 11d will not be required.

Figure 2:
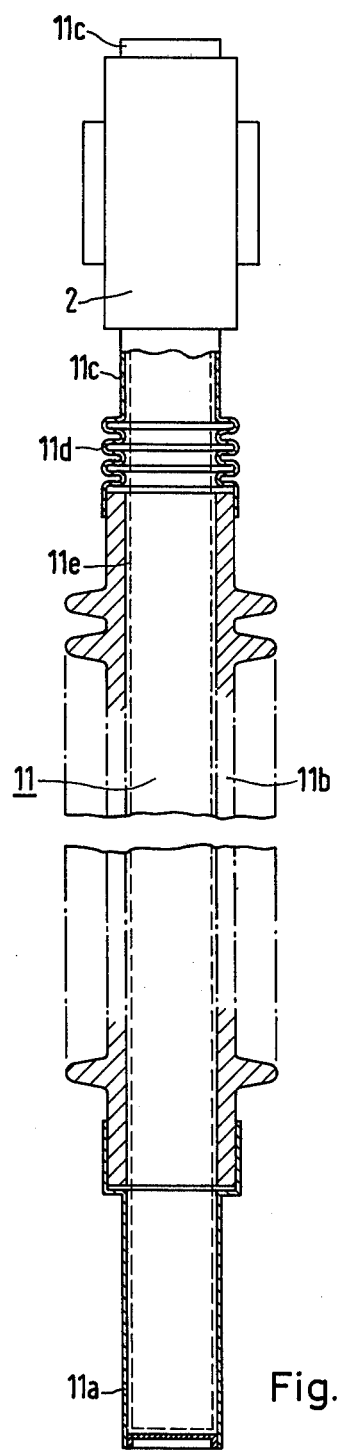
FIG. 2 is a view partially in cross-section showing in more detail a heat pipe of the type which may be used in the arrangement of FIG. 1.

FIG. 2 illustrates, partially in cross-section, a heat pipe for use in the thyristor stack of FIG. 1. As illustrated the vaporization section, i.e., the portion 11c is fastened to the heat sink 2 so as to make good thermal contact. For example, this can be done by shrinking on. Portion 11c passes through the heat sink 2 and has its end projecting therefrom. This free end can be used for properly closing the heat pipe 11 after charging it with its operating fluid. Inside the heat pipe 11 a wick 11e is provided. As shown, the wick 11e need not follow the corrugations in the section 11d but need only rest on the top thereof. The wick should be made of an electrically insulating material at least in the zone of the intermediate section 11b. With regard to this feature and electrically insulating operating fluids with which the heat pipe can be filled, reference can be made to the aforementioned German Utility Model No. 7,224,356.

In summary, it is noted that through the design of the present invention a liquid cooled thyristor stack is obtained in which, through the use of an intermediate circulation system comprising heat pipes, liquid cooling using crude liquids such as unpurified water becomes possible. It should be emphasized that compared to known thyristor columns the cooling of the disk thyristors by means of the heat pipes is even further improved. Because of the elastic or flexible design of the heat pipes and the manner in which they are anchored into the coolant line, thermal and mechanical stresses are avoided thereby permitting the thyristor column of the present invention to be used even in cases where a high resistance to vibration is required. Although specific embodiments have been illustrated and described, it will be obvious to those skilled in the art that various modifications may be made without departing from the spirit of the invention which is intended to be limited solely by the appended claims.

What is claimed is:

1. In a liquid cooled thyristor column in which a plurality of disk thyristors are stacked and clamped in an electrically conducting manner between heat sinks such that each thyristor has a heat sink on each side thereof, the heat sinks also being used for conducting current, the improvement comprising:
    a. a heat pipe inserted through each heat sink and projecting therefrom, each heat pipe including an intermediate section of electrically insulating material and an elastic section between the electrically insulating intermediate section and the heat sink;
    b. a liquid coolant line; and
    c. membranes coupled the free end of each heat pipe to said coolant line.

2. A liquid cooled thyristor column according to claim 1 wherein said membrane is a tube of elastic material.

3. A liquid cooled thyristor column according to claim 2 wherein said membrane is a corrugated tube.

4. A liquid cooled thyristor column according to claim 1 wherein said tube section of elastic material is made of a self-supporting elastic material.

5. A liquid cooled thyristor column according to claim 4 wherein said tube section is a corrugated tube.

6. A liquid cooled thyristor column according to claim 1 in which all of said heat pipes lie essentially in one plane.

7. A liquid cooled thyristor column according to claim 1 wherein all of said heat pipes are immersed in said coolant line.

* * * * *